United States Patent
Male

(10) Patent No.: US 11,211,305 B2
(45) Date of Patent: Dec. 28, 2021

(54) APPARATUS AND METHOD TO SUPPORT THERMAL MANAGEMENT OF SEMICONDUCTOR-BASED COMPONENTS

(71) Applicant: TEXAS INSTRUMENTS INCORPORATED, Dallas, TX (US)

(72) Inventor: Barry Jon Male, West Granbury, CT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 239 days.

(21) Appl. No.: 15/475,378

(22) Filed: Mar. 31, 2017

(65) Prior Publication Data

US 2017/0287804 A1 Oct. 5, 2017

Related U.S. Application Data

(60) Provisional application No. 62/316,901, filed on Apr. 1, 2016.

(51) Int. Cl.
*H01L 23/34* (2006.01)
*H01L 23/38* (2006.01)

(52) U.S. Cl.
CPC ............ *H01L 23/345* (2013.01); *H01L 23/34* (2013.01); *H01L 23/38* (2013.01)

(58) Field of Classification Search
CPC ....... H01L 23/345; H01L 23/34; H01L 23/38; H01L 27/11575; H01L 21/823481;
(Continued)

(56) References Cited

U.S. PATENT DOCUMENTS 3,508,126 A 4/1970 Newman et al.
3,952,265 A 4/1976 Hunsperger
(Continued)

FOREIGN PATENT DOCUMENTS

EP 1986297 10/2008
EP 2490263 A2 8/2012
(Continued)

OTHER PUBLICATIONS

Clark, C. G., "The Basics of Arc Flash, GE Industrial Solutions website accessed Oct. 5, 2016, http://apps.geindustrial.com/publibrary/checkout/ArcFlash4?TNR=White%20Papers%7CArcFlash4%7Cgeneric"; 3 pages.
(Continued)

*Primary Examiner* — Samuel Park
(74) *Attorney, Agent, or Firm* — Mark Allen Valetti; Charles A. Brill; Frank D. Cimino

(57) ABSTRACT

An integrated circuit having a body comprised of semiconducting material has one or more electronic components formed in a first region of the body and at least another electronic component formed in the second region of the body. A thermal barrier separates the two regions. By one approach that thermal barrier comprises a gap formed in the body. The gap may comprise an air gap or may be partially or wholly filled with material that inhibits thermal conduction. The thermal barrier may at least substantially surround the aforementioned second region. The second region may also include one or more temperature sensors disposed therein. A temperature control circuit may use the corresponding temperature information from within the second region to actively control the second region temperature using a temperature forcing element that is disposed at least proximal to the second region.

14 Claims, 3 Drawing Sheets

(58) Field of Classification Search
CPC ....... H01L 21/823878; H01L 27/11548; H01L 27/115; H01L 27/0211; H01L 21/764; H01L 27/14649; H01L 21/76224; H01L 23/367; H01L 27/14; H01L 21/76; H01L 21/82

See application file for complete search history.

(56) References Cited

U.S. PATENT DOCUMENTS

| | | | |
|---|---|---|---|
| 4,007,978 | A | 2/1977 | Holton |
| 4,210,923 | A | 7/1980 | North et al. |
| 4,267,484 | A | 5/1981 | O'Loughlin |
| 4,272,753 | A | 6/1981 | Nicolay |
| 4,757,210 | A | 7/1988 | Bharat et al. |
| 4,891,730 | A | 1/1990 | Saddow et al. |
| 4,916,506 | A | 4/1990 | Gagnon |
| 4,942,456 | A | 7/1990 | Sako |
| 4,996,577 | A | 2/1991 | Kinzer |
| 5,340,993 | A | 8/1994 | Salina et al. |
| 5,389,578 | A | 2/1995 | Hodson et al. |
| 5,514,892 | A | 5/1996 | Countryman et al. |
| 5,629,838 | A | 5/1997 | Knight |
| 5,796,570 | A | 8/1998 | Mekdhanasarn et al. |
| 5,929,514 | A | 7/1999 | Yalamanchili |
| 5,990,519 | A | 11/1999 | Huang-Lu et al. |
| 6,031,251 | A | 2/2000 | Gempe et al. |
| 6,111,305 | A | 8/2000 | Yoshida et al. |
| 6,242,987 | B1 | 6/2001 | Schopf et al. |
| 6,300,632 | B1 | 10/2001 | Liu et al. |
| 6,351,011 | B1 | 2/2002 | Whitney et al. |
| 6,359,276 | B1* | 3/2002 | Tu .............. G01J 5/20 250/332 |
| 6,365,433 | B1 | 4/2002 | Hyoudo et al. |
| 6,507,264 | B1 | 1/2003 | Whitney |
| 6,509,574 | B2 | 1/2003 | Yuan et al. |
| 6,696,752 | B2 | 2/2004 | Su et al. |
| 6,815,808 | B2 | 11/2004 | Hyodo et al. |
| 6,821,822 | B1 | 11/2004 | Sato |
| 6,921,704 | B1* | 7/2005 | Wu ............. H01L 21/76224 257/E21.546 |
| 6,977,468 | B1 | 12/2005 | Baginski |
| 7,015,587 | B1 | 3/2006 | Poddar |
| 7,321,162 | B1 | 1/2008 | Lee |
| 7,334,326 | B1 | 2/2008 | Huemoeller et al. |
| 7,436,054 | B2 | 10/2008 | Zhe |
| 7,732,892 | B2 | 6/2010 | Jeng |
| 7,749,797 | B2 | 7/2010 | Bauer et al. |
| 7,842,542 | B2 | 11/2010 | Shim |
| 7,869,180 | B2 | 1/2011 | Cheung |
| 8,018,705 | B2 | 9/2011 | Michalopoulos |
| 8,159,056 | B1 | 4/2012 | Kim et al. |
| 8,433,084 | B2 | 4/2013 | Conti et al. |
| 8,436,460 | B1 | 5/2013 | Gamboa et al. |
| 8,569,082 | B2 | 10/2013 | Kummerl |
| 8,633,551 | B1 | 1/2014 | Teh |
| 9,006,857 | B1* | 4/2015 | Carr ............. G01J 5/023 257/469 |
| 9,160,423 | B2 | 10/2015 | Brauchler et al. |
| 9,184,012 | B2 | 11/2015 | Wang |
| 9,219,028 | B1 | 12/2015 | Higgins, III et al. |
| 9,419,075 | B1 | 8/2016 | Carothers |
| 9,748,207 | B2 | 8/2017 | Krause et al. |
| 9,761,543 | B1 | 9/2017 | Male et al. |
| 9,926,188 | B2 | 3/2018 | Classen et al. |
| 9,929,110 | B1 | 3/2018 | Male et al. |
| 10,002,700 | B2 | 6/2018 | Lan |
| 2003/0141802 | A1 | 7/2003 | Liebeskind et al. |
| 2003/0183916 | A1 | 10/2003 | Heck et al. |
| 2003/0222205 | A1 | 12/2003 | Shoji |
| 2004/0080025 | A1 | 4/2004 | Kasahara et al. |
| 2004/0084729 | A1 | 5/2004 | Leung |
| 2004/0111881 | A1 | 6/2004 | Yang et al. |
| 2005/0170656 | A1 | 8/2005 | Nasir et al. |
| 2005/0218300 | A1 | 10/2005 | Quinones et al. |
| 2005/0221517 | A1 | 10/2005 | Speyer et al. |
| 2006/0087000 | A1* | 4/2006 | Okuno ............. H01L 21/76232 257/506 |
| 2006/0205106 | A1 | 9/2006 | Fukuda et al. |
| 2006/0281334 | A1 | 12/2006 | Shin et al. |
| 2007/0076421 | A1 | 4/2007 | Kogo et al. |
| 2007/0108388 | A1 | 5/2007 | Lane et al. |
| 2007/0138395 | A1* | 6/2007 | Lane ............. G01J 5/0803 250/353 |
| 2007/0152308 | A1 | 7/2007 | Ha et al. |
| 2007/0229177 | A1 | 10/2007 | Moriya |
| 2007/0278897 | A1 | 12/2007 | Ozaki |
| 2008/0217759 | A1 | 9/2008 | Lin et al. |
| 2008/0266730 | A1 | 10/2008 | Viborg |
| 2008/0290486 | A1 | 11/2008 | Chen et al. |
| 2009/0052214 | A1 | 2/2009 | Edo et al. |
| 2009/0085191 | A1 | 4/2009 | Najafi et al. |
| 2009/0115049 | A1 | 5/2009 | Shiraishi et al. |
| 2009/0127638 | A1 | 5/2009 | Kilger et al. |
| 2009/0261430 | A1 | 10/2009 | Suzuki et al. |
| 2010/0187652 | A1 | 7/2010 | Yang |
| 2010/0244234 | A1 | 9/2010 | Sonobe et al. |
| 2010/0252923 | A1 | 10/2010 | Watanabe et al. |
| 2010/0284553 | A1 | 11/2010 | Conti et al. |
| 2011/0061449 | A1 | 3/2011 | Yagi et al. |
| 2011/0084340 | A1* | 4/2011 | Yuan ............. H01L 21/76224 257/368 |
| 2011/0089540 | A1 | 4/2011 | Drost et al. |
| 2011/0102005 | A1* | 5/2011 | Feng ............. G01R 31/2856 324/750.3 |
| 2011/0108747 | A1 | 5/2011 | Liu |
| 2011/0220996 | A1* | 9/2011 | Kutsukake ........ H01L 21/76229 257/336 |
| 2011/0233790 | A1 | 9/2011 | Bchir |
| 2011/0248374 | A1 | 10/2011 | Akin et al. |
| 2011/0316113 | A1* | 12/2011 | Noda ............. G01J 5/34 257/467 |
| 2012/0299127 | A1 | 11/2012 | Fujii et al. |
| 2013/0134445 | A1 | 5/2013 | Tarsa et al. |
| 2013/0168740 | A1 | 7/2013 | Chen |
| 2013/0194057 | A1 | 8/2013 | Ruby |
| 2013/0315533 | A1 | 11/2013 | Tay et al. |
| 2013/0320459 | A1* | 12/2013 | Shue ............. H01L 21/76283 257/392 |
| 2013/0320548 | A1 | 12/2013 | Carpenter et al. |
| 2013/0329324 | A1 | 12/2013 | Tzviskos |
| 2013/0336613 | A1* | 12/2013 | Meade ............. G02B 6/12 385/14 |
| 2014/0001632 | A1 | 1/2014 | Uehling et al. |
| 2014/0061840 | A1 | 3/2014 | Oguri et al. |
| 2014/0091909 | A1 | 4/2014 | Smith et al. |
| 2014/0264905 | A1 | 9/2014 | Lee et al. |
| 2014/0298825 | A1* | 10/2014 | Noshadi ............. H05K 7/205 62/3.3 |
| 2015/0004902 | A1 | 1/2015 | Pigott et al. |
| 2015/0035091 | A1 | 2/2015 | Ziglioli |
| 2015/0069537 | A1 | 3/2015 | Lo et al. |
| 2015/0094875 | A1* | 4/2015 | Duzly ............. G06F 3/0679 700/300 |
| 2015/0175406 | A1 | 6/2015 | Lin et al. |
| 2015/0180425 | A1* | 6/2015 | Lukashevich ........ H03F 1/30 330/289 |
| 2015/0198493 | A1 | 7/2015 | Kaelberer et al. |
| 2015/0249043 | A1 | 9/2015 | Elian et al. |
| 2015/0255693 | A1 | 9/2015 | Baade et al. |
| 2015/0369681 | A1 | 12/2015 | Imai et al. |
| 2015/0369682 | A1 | 12/2015 | Nakajima |
| 2015/0372034 | A1* | 12/2015 | Chen ............. H01L 27/14614 257/292 |
| 2015/0380353 | A1 | 12/2015 | Bauer et al. |
| 2016/0003436 | A1 | 1/2016 | Singer et al. |
| 2016/0013771 | A1 | 1/2016 | Sridaran et al. |
| 2016/0049341 | A1* | 2/2016 | Pontarollo ............. G01K 7/01 257/48 |
| 2016/0064696 | A1 | 3/2016 | Collier et al. |
| 2016/0087034 | A1* | 3/2016 | You ............. H01L 29/7811 257/390 |

(56) References Cited

U.S. PATENT DOCUMENTS

| | | | |
|---|---|---|---|
| 2016/0103082 A1* | 4/2016 | Kimura | G01N 33/005 73/25.01 |
| 2016/0167089 A1 | 6/2016 | Ng et al. | |
| 2016/0209285 A1 | 7/2016 | Nakajima | |
| 2017/0022049 A1 | 1/2017 | Chu et al. | |
| 2017/0040335 A1* | 2/2017 | Lim | H01L 27/11582 |
| 2017/0047271 A1 | 2/2017 | Zapico | |
| 2017/0089789 A1 | 3/2017 | Kanemoto et al. | |
| 2017/0134004 A1 | 5/2017 | Isozaki et al. | |
| 2017/0275157 A1 | 9/2017 | Zhu et al. | |
| 2017/0330841 A1 | 11/2017 | Cook et al. | |

FOREIGN PATENT DOCUMENTS

| | | | |
|---|---|---|---|
| GB | 2521619 A | 7/2015 | |
| KR | 20170018165 A * | 2/2017 | H01L 28/00 |
| RU | 2201017 C2 | 3/2003 | |
| RU | 2263999 C1 | 11/2005 | |
| RU | 2169962 C2 | 6/2011 | |

OTHER PUBLICATIONS

National Semiconductor Corporation, "Semiconductor Packaging Assembly Technology," National Semiconductor Corporation, Aug. 1999; 8 pages.

Cook, et al., "Floating Die Package", U.S. Appl. No. 15/248,151, filed Aug. 26, 2016; 34 pages.

Notification of Transmittal of the International Search Report and the Written Opinion of the International Searching Authority, or the Declaration; dated May 17, 2018, 8 pages.

Maloberti, F., "Layout of Analog CMOS Integrated Circuit, Part 2 Transistors and Basic Cells Layout," retrieved from http://ims.unipv.it/Courses/download/AIC/Layout02.pdf (and attached hereto), dated Mar. 15, 2004 (38 pages).

Texas Instruments Product Brochure ISO7841x High-Performance, 8000-Vpk Reinforced Quad-Channel Digital Isolator, dated Nov. 2014 (37 pages).

Texas Instruments Application Report "The ISO72x Family of High-Speed Digital Isolators," SLLA198—Jan. 2006 (12 pages).

Texas Instruments Developers Guide "Digital Isolator Design Guide," SLLA284A, Jan. 2009 (19 pages).

Wikipedia article "3D Printing," retrieved from "http://en.wikipedia.org/w/index.php?title=3D_printing&oldid=624190184", dated Sep. 4, 2014 (35 pages).

OSRAM Opto Semiconductors GmbH, Olson Compact (850nm), version 1.6, SFH 4710, dated Dec. 1, 2015, 13pp.

International Search Report for PCT/US20171031987 dated Sep. 7, 2017.

Notification of Transmittal of the International Search Report and the Written Opinion of the International Searching Authority, or the Declaration; dated May 24, 2018, 8 pages.

Search Report for European Patent Application No. 17796774.2, dated May 9, 2019, 2 pages.

Supplementary Search Report for European Patent Application No. 17886649.7, dated Dec. 13, 2019, 1 page.

EU Search Report for Application No. 117 796 774.2-1212, dated Jul. 9, 2020.

* cited by examiner

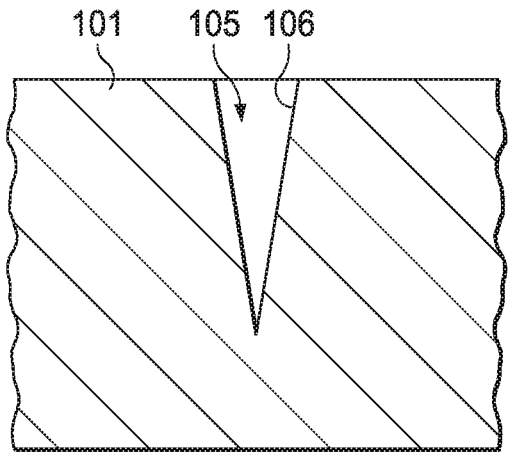
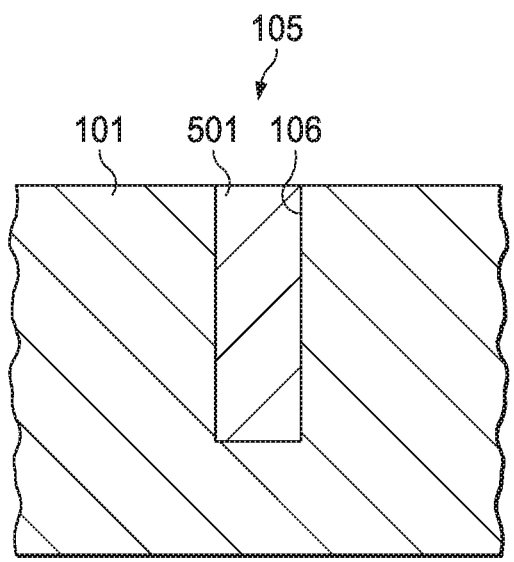
FIG. 4  FIG. 5
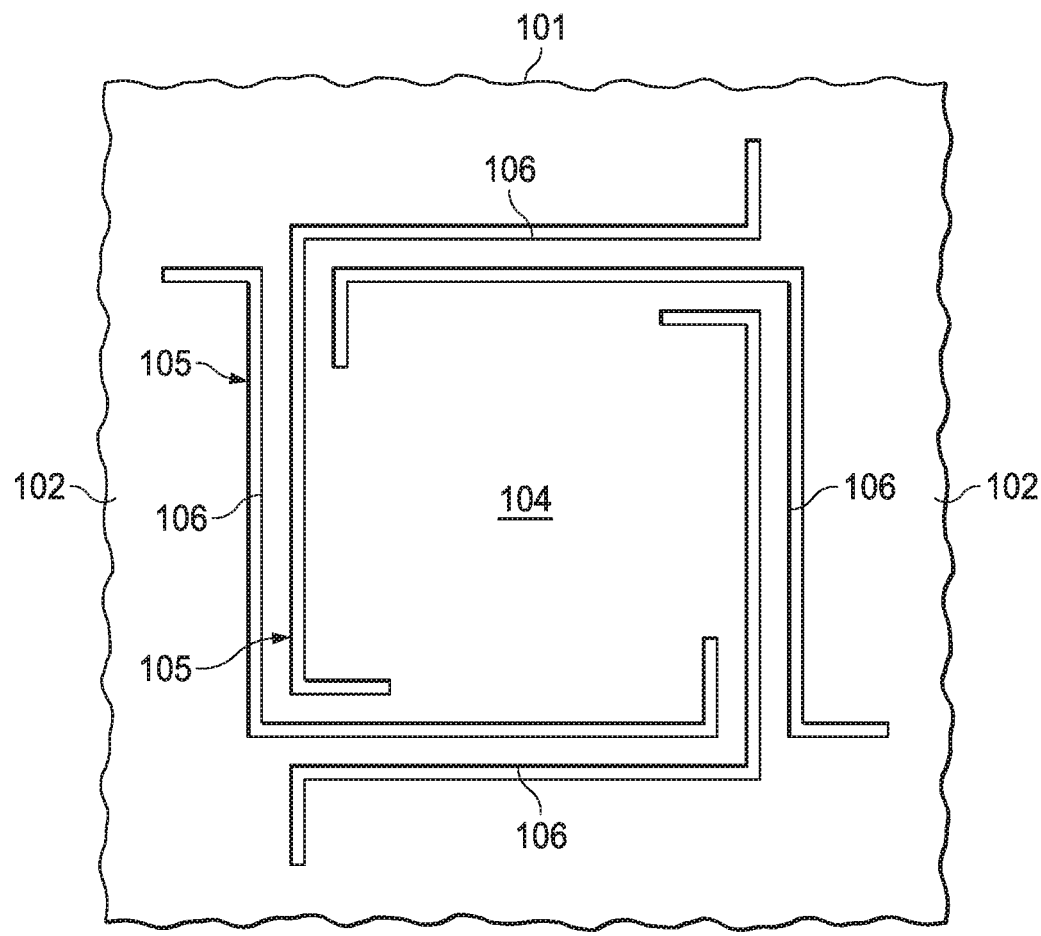
FIG. 6

APPARATUS AND METHOD TO SUPPORT THERMAL MANAGEMENT OF SEMICONDUCTOR-BASED COMPONENTS

RELATED APPLICATION(S)

This application claims the benefit of U.S. Provisional application No. 62/316,901, filed Apr. 1, 2016, which is incorporated by reference in its entirety herein.

TECHNICAL FIELD

These teachings relate generally to integrated circuits and more particularly to the thermal management thereof.

BACKGROUND

The design and manufacture of integrated circuits comprises a well-understood area of prior art endeavor. Integrated circuits typically comprise a plurality of electronic components/circuits on a small flat piece (or "chip") of semiconductor material such as silicon.

It is also known that the performance of the components that comprise an integrated circuit can vary with temperature. This temperature-based variability can lead to inaccurate performance. It is possible in some cases to compensate for temperature variability through clever and exacting selection of components and circuit design. Such an approach, however, can greatly increase cost of the resultant integrated circuit.

By another approach, off-board precision components are utilized in conjunction with an integrated circuit. Using this physically-discrete form factor, the precision component is then maintained in a physically separate thermally-regulated enclosure or location. By precisely maintaining that temperature, the performance of the precision component can be well controlled and form the basis of, for example, precision measurements. Though effective, such a solution can be both very costly and result in a relatively large overall form factor/footprint that greatly undercuts the miniaturization achieved by integrated circuits.

SUMMARY

Generally speaking, pursuant to these various embodiments an integrated circuit having a body comprised of semiconducting material has one or more electronic components formed in a first region of the body and at least another electronic component formed in the second region of the body. That second region of the body is at least partially separated from the first region by a thermal barrier. By one approach that thermal barrier comprises, at least in part, a gap formed in the body. The gap may comprise an air gap or may be partially or wholly filled with material that inhibits thermal conduction. The thermal barrier may at least substantially surround the aforementioned second region.

The second region may also include one or more temperature sensors disposed therein. By one approach the integrated circuit also includes a temperature control circuit that operably couples to the temperature sensor and that uses the corresponding temperature information from within the second region to actively control the second region temperature using a temperature forcing element that is disposed at least proximal to the second region.

By one approach the temperature forcing element comprises a heating-only element such as a resistive element. This heating-only element can be disposed fully within the second region to thereby convey controlled warmth to the electronic component(s) disposed within the second region. By another approach the temperature forcing element comprises a thermal pump (such as a Peltier pump) that employs a thermo-electric material that can be selectively controlled to pump heat from one location to another. If desired, these teachings will accommodate using both a thermal pump and a heating-only element in combination with one another.

So configured, an integrated circuit can include a thermal barrier formed in its semiconductor substrate to at least substantially surround one or more electronic components that are to be specifically thermally regulated. A temperature forcing element that responds to a temperature sensor located within the corresponding thermally-isolated region then actively regulates a temperature that corresponds to the thermally-isolated component(s). So regulated, the component will operate in an accurately predicted and expected manner, with operating results that can be relied upon by other components of the integrated circuit.

These teachings avoid the use of off-board components and hence maintain the space savings associated with integrated circuits. Just as importantly, these teachings can be deployed and utilized in a highly economically-sensitive manner. As a result, these teachings will facilitate the use of temperature-dependent high-precision components at a greatly reduced price as compared to other prior art solutions. These and other benefits may become clearer upon making a thorough review and study of the following detailed description.

BRIEF DESCRIPTION OF THE DRAWINGS

The above needs are at least partially met through provision of the apparatus and method to support thermal management of semiconductor-based components described in the following detailed description, particularly when studied in conjunction with the drawings, wherein:

FIG. 4 comprises a side elevational detail view as configured in accordance with various embodiments of these teachings;

FIG. 5 comprises a side elevational detail view as configured in accordance with various embodiments of these teachings;

FIG. 6 comprises a top plan view as configured in accordance with various embodiments of these teachings;

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
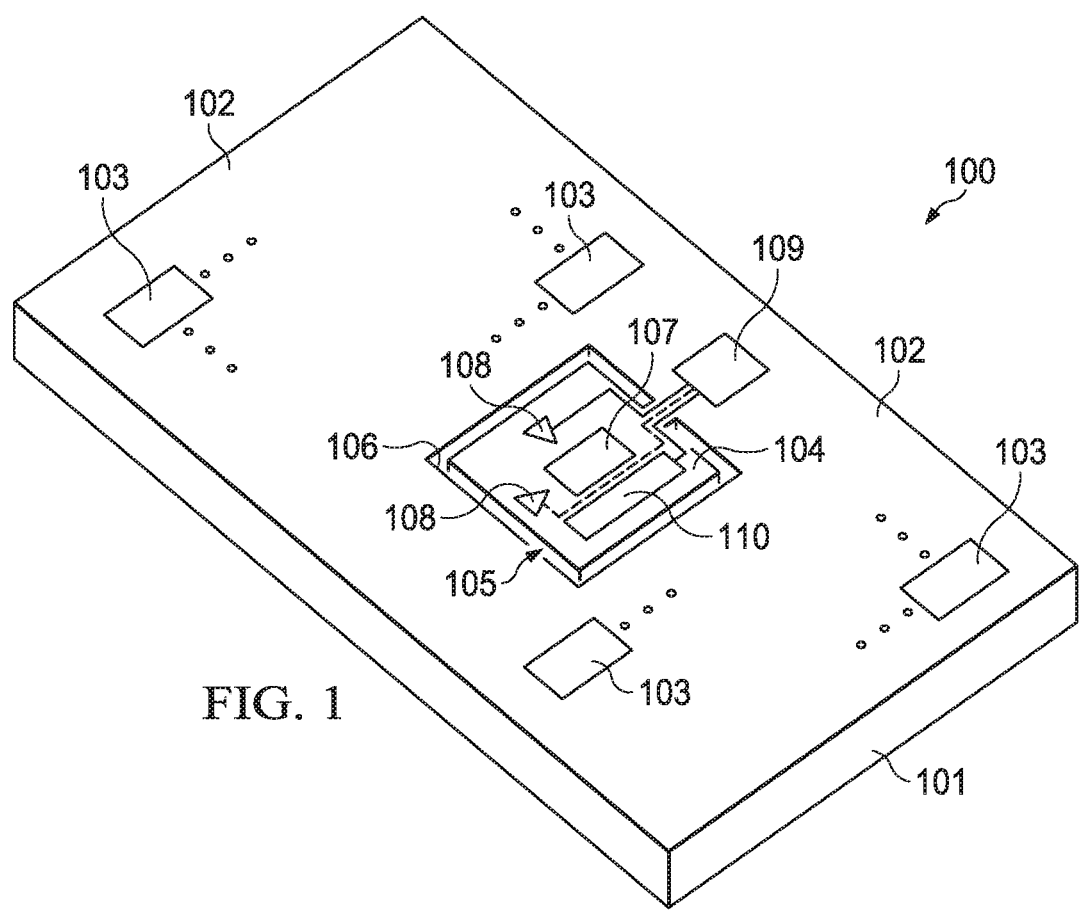
FIG. 1 comprises a perspective view as configured in accordance with various embodiments of these teachings.

Referring now to the drawings, and in particular to FIG. 1, an illustrative integrated circuit 100 that is compatible with many of these teachings will now be presented. (For the sake of simplicity and clarity, many ordinary features of an integrated circuit (such as, for example, multiple layers and additional materials, leads, and pads) are not shown here.)

In this illustrative example the integrated circuit 100 comprises a body/substrate 101 of semiconducting material. Examples include, but are not limited to, silicon, germanium, and so forth. The size and shape of the body/substrate 101 can be as desired as these teachings will tolerate essentially any dimensions and form factor of choice.

In this example the body/substrate 101 includes a first region 102 that comprises, in this example, the majority of the body/substrate 101. This first region 102 includes at least a first electronic component 103 and more typically a plurality of electronic components formed therein. These electronic components 103 can be essentially any known electronic components including both active and passive devices. The first region 102 will also typically include other features such as electrically conductive traces to interconnect the electronic components 103, output/input pads and leads, and so forth; such additional features are not illustrated here for the sake of simplicity and clarity.

The body/substrate 101 also includes a second region 104 formed therein. This second region 104 is at least partially segregated from the first region 102 by a thermal barrier 105. As used herein, a "thermal barrier" will be understood to refer to a physical feature that presents an abrupt thermal discontinuity as regards thermal conductivity. Accordingly, the expression "thermal barrier" does not refer to, for example, a length of the body/substrate 101 where the amount of heat conducted over that length drops in a uniform and/or gradient-like manner as compared to an abrupt discontinuity.

In some application settings this thermal barrier does not serve as part of another electronic component. As will be shown below, however, by another approach this thermal barrier may include a thermo-electric material and hence may act as a thermal pump by applying a voltage difference between the two regions 102 and 104 (assuming their electrical isolation from one another) to cause a current to flow through the thermo-electric material that results in a flow of heat out of the second region 104.

In this illustrative example the thermal barrier 105 comprises, at least in part, a gap 106 formed in the body/substrate 101. Modern semiconductor fabrication techniques provide any number of ways by which such a gap can be formed in the aforementioned semiconductor material. For example, etching-based methodologies that serve to create trenches in semiconductor materials can be readily applied in these regards.

Figure 2:
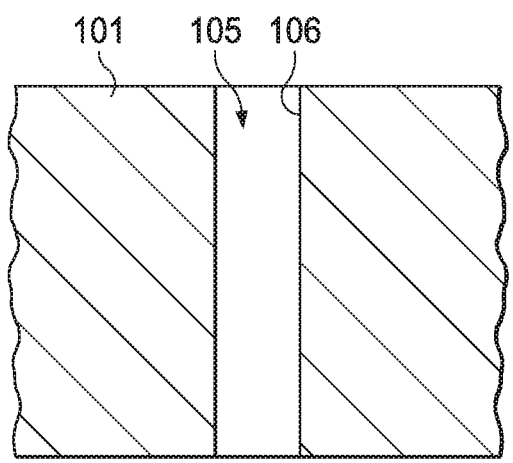
FIG. 2 comprises a side elevational detail view as configured in accordance with various embodiments of these teachings.
Figure 3:
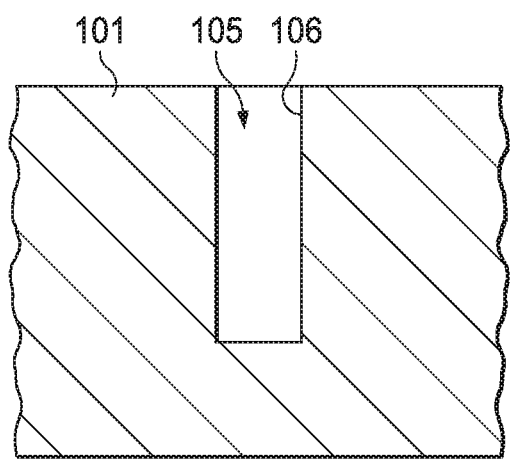
FIG. 3 comprises a side elevational detail view as configured in accordance with various embodiments of these teachings.

FIGS. 2 through 5 provides some illustrative examples in these regards. By one approach, and as shown in FIGS. 2 through 4, the gap 106 comprises an air gap. By one approach, and as shown in FIG. 2, the air gap may extend fully through the body/substrate 101. By another approach, and as shown in FIGS. 3 and 4, the air gap may extend into, but not fully through, the body/substrate 101.

These teachings are highly flexible in practice and will accommodate gaps 106 of various depths and widths. These teachings will also accommodate gaps 106 having different cross-sectional form factors. FIG. 3, for example, illustrates that the gap 106 can have a rectangular cross-section. FIG. 4, as another example, illustrates that the gap 106 can have a triangular or wedge-shaped cross-section. Such examples are intended to serve an illustrative purpose and are not intended to suggest any particular limitations in these regards.

By another approach, the gap 106 can be partially or wholly filled with material of choice. FIG. 5 presents an illustrative example where the gap 106 is completely filled with a plastic material 501. When selecting a material for this purpose, the thermal characteristics of the material 501 should serve to preserve or further enhance the thermal discontinuity presented by the gap 106 itself.

Depending upon the needs of the application setting, the thermal barrier 105 may comprise a single line (straight and/or curved) that may or may not at least substantially surround the aforementioned second region 104. (The aforementioned reference to "substantially" surrounding the second region 104 will be understood to mean to surround by at least 50 percent, and accordingly will include surrounding by at least 75 percent, 80 percent, 90 percent, and 100 percent as desired.) In the illustrative example of FIG. 1, the thermal barrier 105 comprises a square-shaped form factor having an incomplete side. That incomplete side provides a bridge between the first and second regions 102 and 104 to accommodate, for example, electrically-conductive traces to electrically couple electronic components within the second region 104 with electronic components within the first region 102.

A very similar result to what is presented in FIG. 1 can be obtained by employing a plurality of discrete gaps formed in the body/substrate that are separated by only small portions of the body/substrate 101. In such a case, the thermal barrier 105 can be comprised of a plurality of such gaps.

These teachings will accommodate a wide variety of pathway shapes for the gap(s). Examples include but are not limited to rectangles, circles, ellipses, triangles, octagon's, pentagons, and essentially any open or closed, regular or irregular polygon.

In these examples the gap originates from the front surface of the substrate 101. These teachings will also accommodate, however, employing a gap that originates from the back surface thereof. For example, these teachings will accommodate a backside etched trench that etches all the way up to but not through the inter-metal dielectrics of a silicon top. In this way silicon is removed while oxide and metal interconnects are left to support the center structure.

FIG. 6 presents an example where the thermal barrier 105 comprises four discrete gaps 106 formed in the body/substrate 101. Each gap 106 includes two long legs disposed at 90° to one another and two short legs disposed at the end points thereof (with one of the short legs being disposed inwardly towards the second region 104 and the remaining short leg being disposed outwardly into the first region 102). So configured, the second region 104 is highly thermally isolated from the first region 102 by, at least for the most part, at least two parallel gaps. At the same time, there are numerous, albeit narrow, bridging pathways between the first and second regions that can serve to include electrically-conductive traces to facilitate electrical interconnections between the two regions as needed. It will be noted that a similar design paradigm can be formed using other shapes such as rectangles, circles, and so forth.

In a typical application setting the size of the second region 104 will tend to constitute only a minor portion of the overall body/substrate 101. For example, the second region 104 in a given application setting may constitute only 20 percent, 10 percent, 5 percent, or less of the overall body/substrate 101. This relatively diminutive size will typically accord with the fact that in a typical application setting the first region 102 will harbor the vast majority of the electronic components while the second region 104 will form a thermally-isolated region of the body/substrate 101 that serves to harbor only a minority of the electronic components (typically only one or no more than a very few electronic components) that are to be selectively individually thermally regulated. (Other electronic components may also be included in the second region 104 as described below.)

To be clear, the aforementioned thermal barrier 105 (such as the above-described air gap 106) formed in the semiconductor body/substrate 101 serves to reduce the number and quality of thermal conduction pathways between regions (i.e., the aforementioned first region 102 and the aforementioned second region 104) of the semiconductor body/substrate 101 on either side of the thermal barrier 105.

With continued reference to FIG. 1, the second region 104 will typically include at least one electronic component 107 to be thermally regulated/protected. These teachings will accommodate all manner and type of electronic components including both passive and active devices and assemblies. (These teachings may also be applied in conjunction with miniature mechanical assemblies that may or may not have a corresponding electronic or electrical attribute.) In some application settings there may be only one such electronic component 107 to be protected in this manner.

The second region 104, in this illustrative example, includes at least one, two, or more temperature sensors 108. Temperature sensing elements are known in the art and the present teachings are not overly sensitive with respect to any particular choices in these regards. Such temperature sensors 108 operably coupled to a temperature control circuit 109 (the latter being disposed in the first region 102 in this illustrative embodiment, though these teachings will readily accommodate placing part or all of the temperature control circuit 109 within the second region 104). The temperature control circuit 109 may employ fixed and/or programmable logic and/or analog circuitry to compare sensed temperature information from the one or more temperature sensors 108 with one or more predetermined thresholds or setpoints and to respond accordingly by using at least one temperature forcing element to thereby regulate a temperature that corresponds to the electronic component 107 to be regulated/protected.

These teachings will accommodate various approaches to the aforementioned temperature forcing element. Generally speaking, this element comprises an element that can exude and/or absorb/direct heat via conduction (at least as a primary means of thermal transfer). Generally speaking, the temperature forcing element is disposed at least proximal to the second region 104. As used herein, this reference to being "proximal" will be understood to mean that the temperature forcing element is wholly disposed within the second region, or is at least partially disposed within the second region but may have a portion thereof that bridges the aforementioned thermal barrier 105 and/or that resides (equally or unequally) within the first region 102.

By one approach, and as illustrated in FIG. 1, the temperature forcing element comprises a heating-only element 110. For example, certain resistance circuit elements are known to readily convert electricity into heat and can be readily applied in these regards. So configured, this heating-only element 110, when energized/activated by the temperature control circuit 109 (in response, at least in part, to sensed temperature information within the second region 104), will convert electricity into heat to thereby warm the electronic component 107 that is being thermally regulated/protected.

By another approach, in lieu of the foregoing or in combination therewith, the temperature forcing element can comprise a thermal pump. In this application setting the thermal pump comprises, at least in part, a thermal-electric material that is electrically conductive while also being thermally insulated. More particularly, the thermal pump serves to "pump" heat from one side of itself to another. Thermal pumps are themselves generally well understood in the art and require no further elaboration here.

Figure 7:
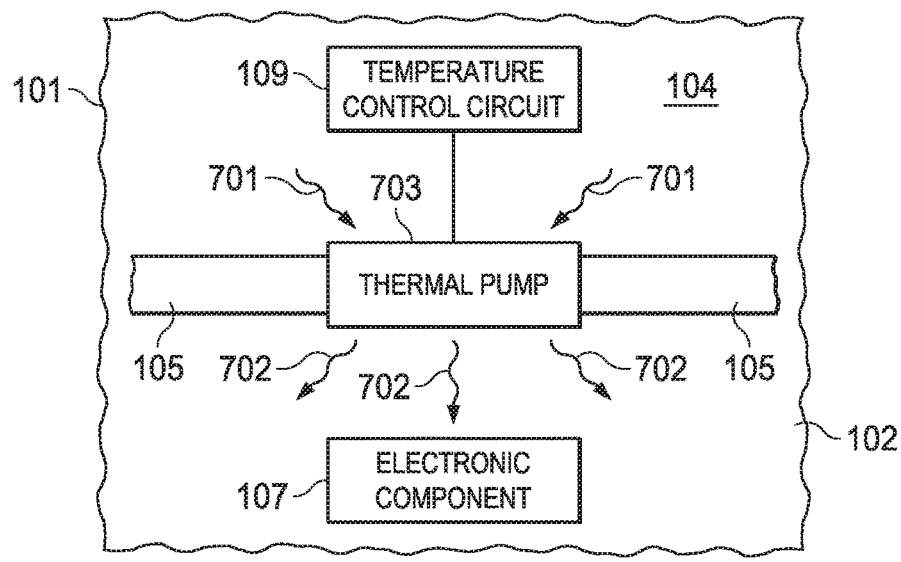
FIG. 7 comprises a top plan block diagram view as configured in accordance with various embodiments of the invention.

FIG. 7 provides an illustrative example in these regards. In this example the thermal pump 703 has portions in both the first region 102 and the second region 104 and bridges the thermal barrier 105 as well. So configured, the thermal pump 703 responds to the control of the temperature control circuit 109 by selectively pumping heat 701 from the first region 102 across the thermal barrier 105 and into the second region 104 via conduction (the exuded heat being denoted by reference numeral 702). Depending upon the needs of the application setting, the thermal pump 703 could be operated in a reverse mode of operation to thereby pump heat away from the electronic component 107 in the second region 104 and thereby cool the electronic component 107 as part of the temperature regulation functionality.

Figure 8:
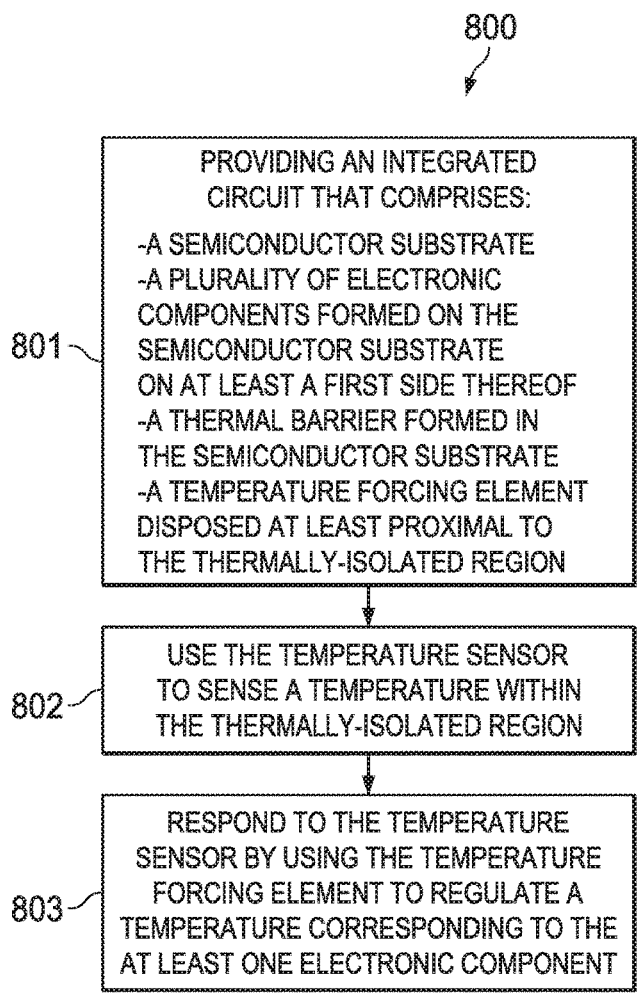
FIG. 8 comprises a flow diagram as configured in accordance with various embodiments of these teachings.

FIG. 8 presents an illustrative example of a corresponding process 800 for thermally regulating/protecting a predetermined electronic component. At block 801 of this process 800 this process 800 provides an integrated circuit that comprises a semiconductor substrate, a plurality of electronic components formed on the semiconductor substrate on at least a first side thereof, a thermal barrier formed in the semiconductor substrate at least substantially around at least one but not more than a minority of the plurality of electronic components to thereby form a thermally-isolated region of the semiconductor substrate that harbors the at least one but not more than a minority of the plurality of electronic components, wherein the foregoing electronic components include at least one electronic component to be thermally regulated along with at least one temperature sensor, and a temperature forcing element disposed at least proximal to the thermally-isolated region.

At block 802 this process 800 provides for using the aforementioned temperature sensor to sense a temperature within the thermally-isolated region formed as described above. At block 803, this process 800 provides for responding to the temperature sensor by using the aforementioned temperature forcing element to regulate a temperature corresponding to the at least one electronic component to be thermally regulated.

So configured, these teachings will accommodate thermally regulating/protecting one or more electronic components on/in a semiconductor substrate in a way that avoids expending energy to similarly thermally modulate other electronic components on/in the semiconductor substrate that do not require such care. Those skilled in the art will appreciate that these teachings permit such thermal control for on-board components and hence avoids the need for off-board components having their own discrete thermal regulation/protection.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. An apparatus comprising:
a body including semiconducting material, the body having a first region and a second region laterally spaced from the first region;
a first electronic component formed in the first region;
a second electronic component formed in the second region, wherein the second region of the body is at least partially separated from the first region by a thermal barrier, the thermal barrier including a solid material having a lower thermal conductivity than the semiconducting material;
wherein the thermal barrier includes a bridging pathway formed of the semiconducting material thereby making the thermal barrier discontinuous; and
a temperature forcing element at least partially in the second region and connected to the first region, the temperature forcing element to cause heat transfer between the first region and the second region by conduction.

2. The apparatus of claim 1, wherein the apparatus includes an integrated circuit.

3. The apparatus of claim 1, wherein the thermal barrier comprises a plurality of discrete gaps formed in the body, each of the plurality of discrete gaps separated by the semiconducting material.

4. The apparatus of claim 3, wherein the plurality of discrete gaps at least substantially surround the second electronic component.

5. The apparatus of claim 1, wherein the thermal barrier extends into, but not fully through, the body.

6. The apparatus of claim 1 further including a temperature sensor disposed within the second region.

7. The apparatus of claim 1, wherein the temperature forcing element is a thermal pump.

8. An integrated circuit comprising:
a semiconductor substrate including a first region and a second region;
a plurality of electronic components formed at least partially in the semiconductor substrate;
a thermal barrier formed in the semiconductor substrate at least substantially around the first region including at least one of the plurality of electronic components, the thermal barrier including a solid material;
wherein the thermal barrier has at least two coextending gaps in the semiconductor substrate thereby making the thermal barrier discontinuous, and
a temperature forcing element at least partially in the first region and connected to a second region at an opposite side of the thermal barrier to cause heat transfer between the first region and the second region by conduction.

9. The integrated circuit of claim 8, wherein the semiconductor substrate includes a silicon substrate.

10. The integrated circuit of claim 8, wherein the two coextending gaps include air gaps formed in the semiconductor substrate to reduce thermal conduction pathways between regions of the semiconductor substrate on either side of the air gaps.

11. The integrated circuit of claim 8, wherein the thermal barrier further includes additional gaps formed in the semiconductor substrate to substantially surround the at least one of the plurality of electronic components.

12. The integrated circuit of claim 11, wherein the at least one of the plurality of electronic components includes:
at least one electronic component to be thermally regulated; and
a temperature sensor.

13. The integrated circuit of claim 12, wherein the temperature forcing element is a thermal pump.

14. The integrated circuit of claim 13, wherein the temperature forcing element is operably responsive to the temperature sensor and is configured to regulate a local temperature to thereby thermally regulate the at least one electronic component to be thermally regulated.

* * * * *